United States Patent
Sipani et al.

(10) Patent No.: US 9,358,753 B2
(45) Date of Patent: *Jun. 7, 2016

(54) SUBSTRATES AND METHODS OF FORMING A PATTERN ON A SUBSTRATE

(71) Applicant: Micron Technology, Inc., Boise, ID (US)

(72) Inventors: Vishal Sipani, Boise, ID (US); David A. Kewley, Boise, ID (US); Kyle Armstrong, Meridian, ID (US); Michael Dean Van Patten, Fruitland, ID (US); Michael D. Hyatt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/788,890

(22) Filed: Jul. 1, 2015

(65) Prior Publication Data

US 2015/0321447 A1    Nov. 12, 2015

Related U.S. Application Data

(62) Division of application No. 13/463,468, filed on May 3, 2012, now Pat. No. 9,102,121.

(51) Int. Cl.
| *B32B 3/30* | (2006.01) |
| *G03F 7/00* | (2006.01) |
| *G03F 7/20* | (2006.01) |
| *G03F 7/40* | (2006.01) |
| *H01L 21/311* | (2006.01) |
| *H01L 21/033* | (2006.01) |

(52) U.S. Cl.
CPC ............... *B32B 3/30* (2013.01); *G03F 7/0035* (2013.01); *G03F 7/2002* (2013.01); *G03F 7/40* (2013.01); *H01L 21/0337* (2013.01); *H01L 21/31144* (2013.01); *Y10T 428/24521* (2015.01); *Y10T 428/24612* (2015.01)

(58) Field of Classification Search
CPC . B32B 3/30; G03F 7/0035; Y10T 428/24521; H01L 21/31144
See application file for complete search history.

(56) References Cited

U.S. PATENT DOCUMENTS

| 5,328,810 | A | 7/1994 | Lowrey et al. |
| 7,531,449 | B2 | 5/2009 | Park et al. |
| 7,989,354 | B2 | 8/2011 | Nakajima et al. |
| 8,003,543 | B2 | 8/2011 | Koh et al. |
| 8,062,981 | B2 | 11/2011 | Lee et al. |
| 2002/0052127 | A1 | 5/2002 | Gau et al. |
| 2006/0216922 | A1* | 9/2006 | Tran ............... H01L 21/0337 438/618 |
| 2007/0249170 | A1* | 10/2007 | Kewley ............ H01L 21/0337 438/706 |
| 2009/0130590 | A1* | 5/2009 | Chen ............... G03F 7/0035 430/270.1 |
| 2009/0258492 | A1 | 10/2009 | Sant et al. |
| 2010/0035191 | A1 | 2/2010 | Huang et al. |
| 2010/0297847 | A1 | 11/2010 | Cheng et al. |

* cited by examiner

*Primary Examiner* — Brittany Raymond
(74) *Attorney, Agent, or Firm* — Wells St. John, P.S.

(57) ABSTRACT

Substrates and methods of forming a pattern on a substrate. The pattern includes a repeating pattern region and a pattern-interrupting region adjacent to the repeating pattern region. A mask is formed on the substrate, with the mask including the repeating pattern region and the pattern-interrupting region and which are formed using two separate masking steps. The mask is used in forming the pattern into underlying substrate material on which the mask is received. Substrates comprising masks are also disclosed.

13 Claims, 5 Drawing Sheets

SUBSTRATES AND METHODS OF FORMING A PATTERN ON A SUBSTRATE

RELATED PATENT DATA

This application is a divisional of U.S. patent application Ser. No. 13/463,468, which was filed on May 3, 2012, entitled "Substrates And Methods Of Forming A Pattern On A Substrate", listing Vishal Sipani, David A. Kewley, Kyle Armstrong, Michael Dean Van Patten, and Michael D. Hyatt as inventors, the disclosure of which is incorporated herein by reference.

TECHNICAL FIELD

Embodiments disclosed herein pertain to substrates and to methods of forming a pattern on a substrate.

BACKGROUND

Integrated circuits are often formed on a semiconductor substrate such as a silicon wafer or other semiconductive material. In general, layers of various materials which are semiconductive, conductive, or dielectric are used to form the integrated circuits. By way of examples, the various materials are doped, ion implanted, deposited, etched, grown, etc. using various processes. A continuing goal in semiconductor processing is to strive to reduce the size of individual electronic components, thereby enabling smaller and denser integrated circuitry.

One type of integrated circuitry comprises memory. Individual memory cells of such circuitry are densely packed within a memory array area, and have conductive lines extending outwardly there-from to connect with control circuitry outside of the memory array area. One type of layout comprises a memory array area having word lines extending there-across. One example type of memory which may use such layout is a non-volatile memory known as flash. Flash memory is a type of EEPROM (Electrically-Erasable Programmable Read-Only Memory) that may be erased and reprogrammed in blocks. Most personal computers have BIOS stored on a flash memory chip. Further, flash continues to find increasing use in consumer devices such as MP3 players, cell phones, digital cameras, etc.

There is a continuing goal in the fabrication of memory and other integrated circuitry to reduce feature sizes, such as the widths of word lines, to create smaller and denser integrated circuitry. Reduced feature sizes for integrated circuits are related to the techniques used to form those features. For example, photolithography is one technique used to pattern features of integrated circuits. A concept commonly referred to as "pitch" is used to describe the sizes of the features in conjunction with spaces immediately adjacent thereto. Pitch may be defined as the distance between an identical point in two neighboring features of a repeating pattern, thereby including the maximum width of the feature and the space to the next immediately adjacent feature. Due to factors such as optics and light or radiation wave length, photolithography techniques tend to have a minimum pitch below which a particular photolithographic technique cannot reliably form features. Thus, minimum pitch of a photolithographic technique is an obstacle to continued feature size reduction using photolithography.

Pitch multiplication is one proposed method for extending the capabilities of photolithographic techniques beyond their minimum pitch. This method forms features narrower than minimum photolithography resolution by, for example, depositing spacer-forming layers that have a lateral thickness that is less than that of the minimum capable photolithographic feature size. The spacer-forming layer is anisotropically etched to form sub-lithographic features, and then the features which were formed at the minimum photolithographic feature size may be etched from the substrate. Using such techniques where pitch is actually halved, the reduction is commonly referred to as pitch "doubling". More generally, pitch "multiplication" encompasses change in pitch by two or more times, and also of fractional values other than integers. Thus, conventionally, "multiplication" of pitch by a certain factor actually involves reduction of the pitch by that factor.

Photolithographic and other techniques used to pattern an array of repeating features may not form those features at the edges of the array the same as those formed within a more central region away from the array edges. This is due to optical or other effects that result in the edge features patterning differently than the more central features. Existing manners for overcoming these drawbacks are to form the edge features to be larger and/or have greater pitch than the more central region features. Alternately or additionally, dummy features may be formed at the edge(s) of arrays which either do not resolve into underlying substrate material or result in the formation of underlying structures having no circuit function. Regardless, these example prior art techniques for overcoming this problem undesirably consume horizontal substrate area which might otherwise be used in the fabrication of operable circuit components.

DETAILED DESCRIPTION OF EXAMPLE EMBODIMENTS

Figure 1:
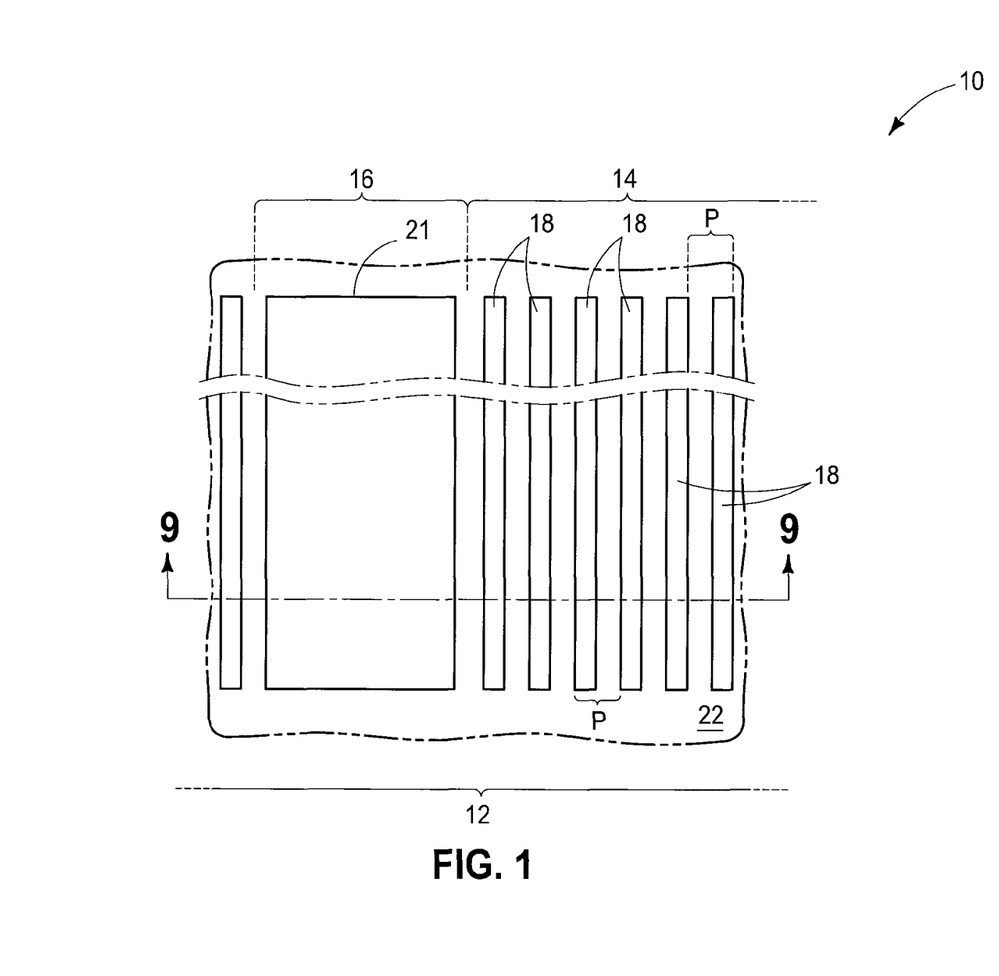
FIG. 1 is a diagrammatic top-plan view of a substrate fragment processed in accordance with an embodiment of the invention.

Initial example embodiments of methods of forming a pattern on a substrate are described with references to FIGS. 1-11. FIG. 1 is a top-down view of a substrate fragment 10 having a portion of a pattern 12 formed thereon. Substrate 10 may comprise a substrate upon which integrated circuitry is being or has been fabricated, and regardless may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Pattern 12 may be characterized by some repeating pattern region 14 and a pattern-interrupting region 16 adjacent thereto (i.e., a region where the repeating pattern proximate the edge of region 14 is interrupted or changes). Repeating pattern region 14 in the depicted example comprises repeating features shown in the form of longitudinally-elongated lines 18 received over underlying substrate material 22, and which are approximately/approaching straight and parallel relative to one another (e.g., transistor gate line constructions, for example charge-retaining gate lines of flash memory circuitry or other circuitry). Alternate line configurations and/or non-line features may be formed. In one embodiment, repeating pattern region 14 comprises a repeating feature pattern that is of constant pitch "P" at least immediately adjacent to pattern-interrupting region 16.

Pattern-interrupting region 16 is shown as comprising a single feature 21 in the form of a rectangle or longitudinally-elongated line received over underlying substrate material 22. Alternately by way of examples only, pattern-interrupting region 16 may comprise a single feature of alternate size and/or shape, or may include multiple features of the same configuration or of varying configuration(s). For example, pattern-interrupting region 16 may comprise multiple smaller features (not shown) that perhaps include some repeating pattern other than that associated with the size and/or shape of the features at the edge of repeating pattern region 14. As a specific example, the pattern-interrupting region may comprise one or more raised features having a plurality of contact openings or conductive vias formed there-through (not shown). In one embodiment, feature 21 is continuous over at least a majority of pattern interrupting region 16. Regardless, the pattern-interrupting region is adjacent to an edge of the repeating pattern region and may comprise an intermediate pattern-interrupting region between two otherwise adjacent repeating pattern regions that may have the same or different respective repeating patterns.

Figure 2:
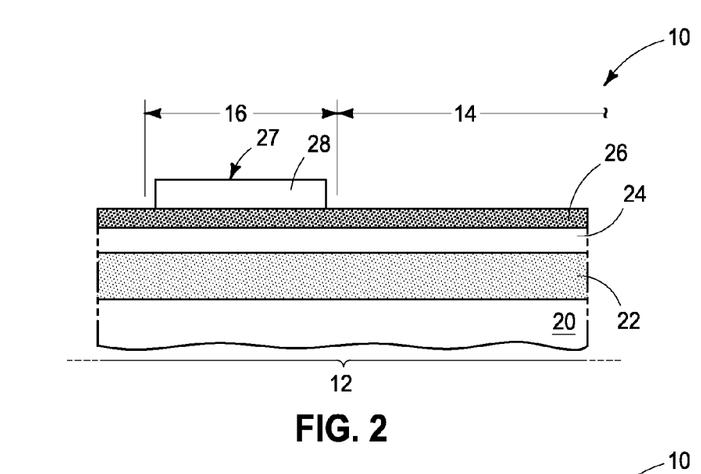
FIG. 2 is a diagrammatic cross-sectional view of a substrate fragment in process in accordance with an embodiment of the invention.

Referring to FIG. 2, an example predecessor substrate 10 that may be used in ultimately producing the example substrate of FIG. 1 is shown. The FIG. 2 substrate 10 is shown as comprising innermost substrate material 20 and a hard-masking material 22 there-over. Each may be homogenous or non-homogenous, with an example hard-masking material being spin-on-carbon. An example thickness range for material 22 is from about 50 Angstroms to about 500 Angstroms. Outermost portions of substrate material 20, as an example, may comprise a stack of conductive, semiconductive, and/or dielectric materials for formation of transistor gates, for example charge-retaining gates of NAND flash or other memory circuitry, or of non-memory circuitry. Alternate substrate material(s) may be used to fabricate, for example, other circuitry or non-circuitry components.

An elevationally inner masking material 24 and an elevationally outer masking material 26 are received over underlying substrate material 22/20. Materials 24 and 26 may be of the same composition or of different compositions, and if of different compositions may each be homogenous or non-homogenous. If of the same composition and homogenous, materials 24 and 26 may be indistinguishable from one another, for example being inner and outer portions of the same material. One or both of materials 24 and 26 may comprise an antireflective coating. As specific anti-reflective examples, outer material 26 may comprise silicon-rich $Si_xO_yN_z$ and inner material 24 may comprise oxygen-rich $Si_xO_yN_z$, or vice-versa. An example thickness range for each of materials 24 and 26 is from about 50 Angstroms to about 500 Angstroms.

A masking block 27 has been formed over outer masking material 26 within pattern-interrupting region 16. In one embodiment, masking block 27 comprises photoresist 28, for example which has been patterned into the depicted shape from a blanketing layer of photoresist. Alternate existing or yet-to-be developed techniques might be used to form example masking block 27.

Figure 3:
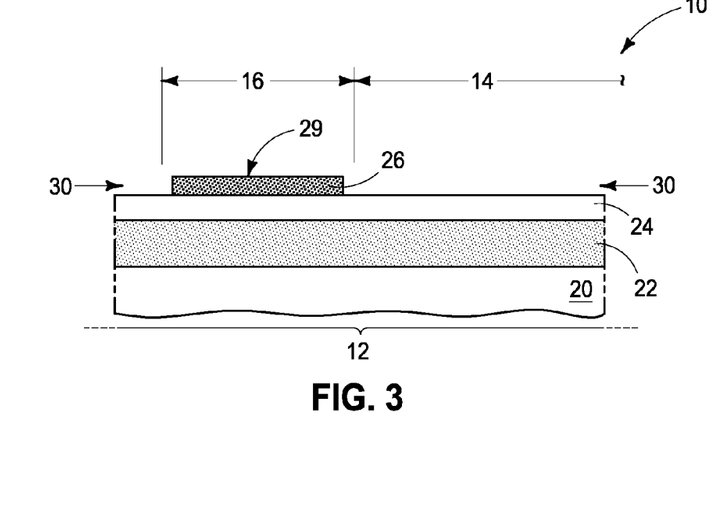
FIG. 3 is a view of the FIG. 2 substrate at a processing step subsequent to that shown by FIG. 2.

Referring to FIG. 3, outermost masking material 26 has been patterned using masking block 27 (not shown) to mask pattern-interrupting region 16 (e.g., at least a majority thereof) and to expose repeating pattern region 14, and masking block 27 has been removed.

In one embodiment and for example as shown, FIGS. 2 and 3 show an example of forming a pattern-interrupting region mask 30 elevationally over underlying substrate material 24/22/20, with the pattern-interrupting region mask comprising a raised masking feature 29. Raised masking feature 29 may be of the same substantial size and shape as raised feature 21 in FIG. 1. Further, more than one raised masking feature (not shown) may be formed within pattern-interrupting region 16. Other raised masking features (not shown) would likely be formed outside of the depicted pattern-interrupting region 16 and repeating pattern region 14, for example in formation of other pattern interrupting or other regions or features on the substrate. For example and by way of example only, raised masking features of a pattern-interrupting region mask may be formed at both opposing lateral edges (not shown) and/or at one or both of opposing longitudinal ends (not shown) of individual repeating pattern regions. Further, the material of the pattern-interrupting region mask may be used elsewhere over the substrate to form operative or non-operative circuitry components where integrated circuitry is being fabricated.

Figure 4:
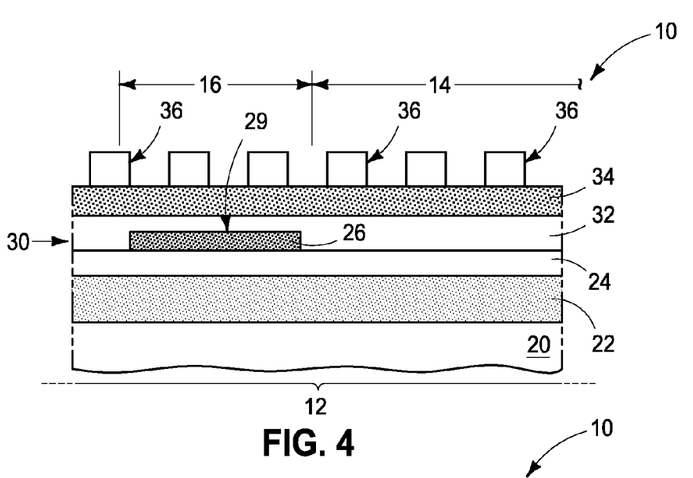
FIG. 4 is a view of the FIG. 3 substrate at a processing step subsequent to that shown by FIG. 3.

Referring to FIG. 4, a planarizing film 32 has been formed elevationally over patterned outermost masking material 26 and over innermost masking material 24. Planarizing film 32 may be formed by any suitable technique, for example deposited as a spin-on-material that inherently produces a generally planar outer surface, or by deposition of a conformal material to a suitable thickness followed by planarizing the conformal material. An example thickness range for planarizing film 32 is from about 50 Angstroms to about 2,500 Angstroms. Planarizing film 32 may be homogenous or non-homogenous, and regardless may be of the same composition or of different composition from that of one or both of innermost masking material 24 and outermost masking material 26. A hard-masking material 34 has been formed over planarizing film 32, and patterned feature blocks 36 have been formed over hard-masking material 34. Feature blocks 36 may, by way of example, comprise photoresist having been formed using photolithography. Hard-masking material 34 may be homogenous or non-homogenous, with an example thickness range being from about 50 Angstroms to about 500 Angstroms. Hard-masking material 34 may be of different composition from that of planarizing film 32, and may provide an anti-reflective function in any photolithographic pattern used to form example feature blocks 36.

Figure 5:
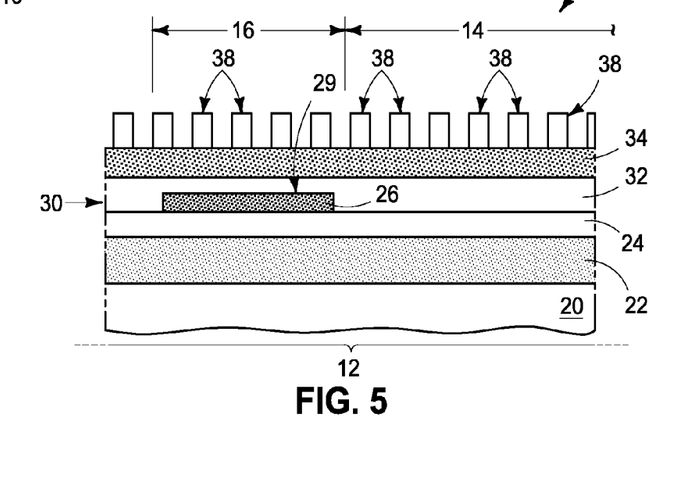
FIG. 5 is a view of the FIG. 4 substrate at a processing step subsequent to that shown by FIG. 4.

Referring to FIG. 5, feature blocks 36 (not shown) have been used in a pitch-multiplication technique (e.g., pitch doubling) in forming masking features 38. By way of example, the FIG. 5 construction may be formed by initially laterally trimming the feature blocks 36 in FIG. 4 and thereafter depositing a conformal material having elevational thickness over the tops of feature blocks 36 and lateral thickness over sidewalls of feature blocks 36 that is substantially equal to the depicted lateral thickness/width of masking features 38. The conformal material may then be anisotropically etched to remove it from being received elevationally over feature blocks 36 and from between those portions of the conformal material received against the sidewalls of feature blocks 36. Feature blocks 36 may thereafter be removed, thereby forming the FIG. 5 construction. Masking blocks 38 may, for example, be of the same substantial size and shape as lines 18 in FIG. 1.

Figure 6:
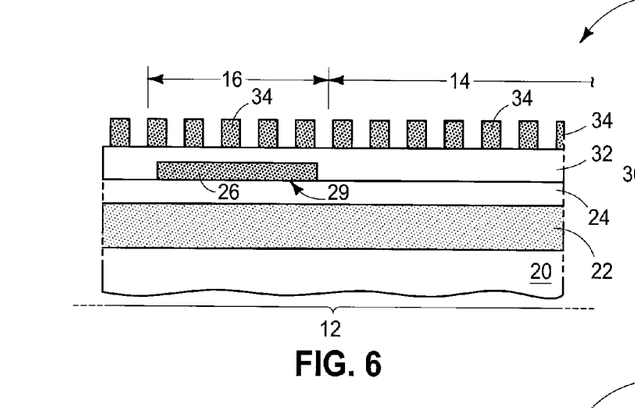
FIG. 6 is a view of the FIG. 5 substrate at a processing step subsequent to that shown by FIG. 5.

Referring to FIG. 6, masking features 38 (not shown) have been used as a mask to form a repeating feature pattern in hard-masking material 34, and masking features 38 have been removed.

Figure 7:
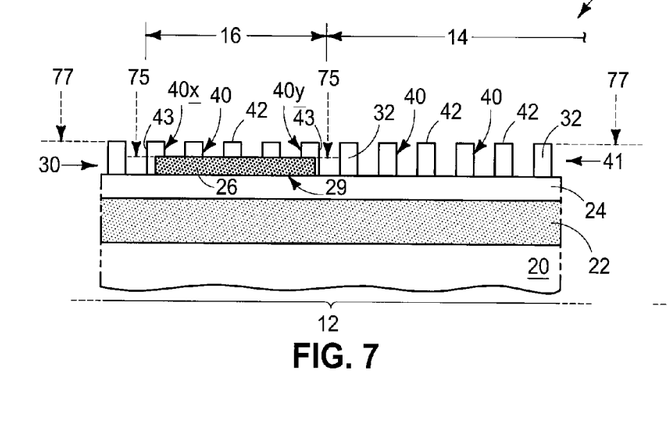
FIG. 7 is a view of the FIG. 6 substrate at a processing step subsequent to that shown by FIG. 6.

Referring to FIG. 7, the hard-masking features of material 34 (not shown) of FIG. 6 have been used as a mask in etching into planarizing film 32 to form a repeating pattern of raised masking features 40 that are elevationally over outermost masking material 26 within pattern-interrupting region 16 and elevationally over inner masking material 24 within repeating pattern region 14. Techniques other than or in addition to those described above and depicted with respect to FIGS. 4-7 may be used in patterning the planarizing film into the example repeating pattern of raised masking features 40. Further alternately, by way of example, processing may occur whereby no planarizing film 32 and/or no hard-masking material 34 is used, for example with raised masking features 40 being formed directly from one or more materials. Regardless, in one embodiment raised masking features 40 may be considered as comprising a repeating pattern region mask 41 that has been formed over pattern-interrupting region mask 30 regardless of how masks 30 and 41 are formed. Repeating pattern region mask 41 comprises multiple raised masking features 40 that are elevationally over raised masking feature 29 of pattern-interrupting region mask 30 and multiple raised masking features 40 that are not elevationally over raised masking feature 29 of pattern-interrupting region mask 30. In one embodiment and as shown, multiple raised masking features 40 that are over and not over raised masking feature 29 have respective elevationally outermost surfaces 42 that are planar, and in one embodiment that are co-planar.

The raised masking features 40 that are elevationally over raised masking feature 29 in pattern-interrupting region 16 may be considered as comprising a pair of laterally-outermost raised masking features 40x and 40y relative to raised masking feature 29. Further, masking features 40x and 40y may be considered as having laterally outermost edges 43 relative to raised masking feature 29. The depicted FIG. 7 construction shows an example wherein raised masking feature 29 does not extend laterally beyond either of laterally outermost edges 43 of masking features 40x and 40y. Alternately, by way of example, masking feature 29 may extend laterally beyond at least one of laterally outermost edges 43 of features 40x or 40y (not shown in FIG. 7). When masking features 40x and 40y laterally extend beyond both outer edges of masking feature 29, they may do so to the same amount/degree (not shown) or to different amounts/degrees (for example, as shown).

Figure 8:
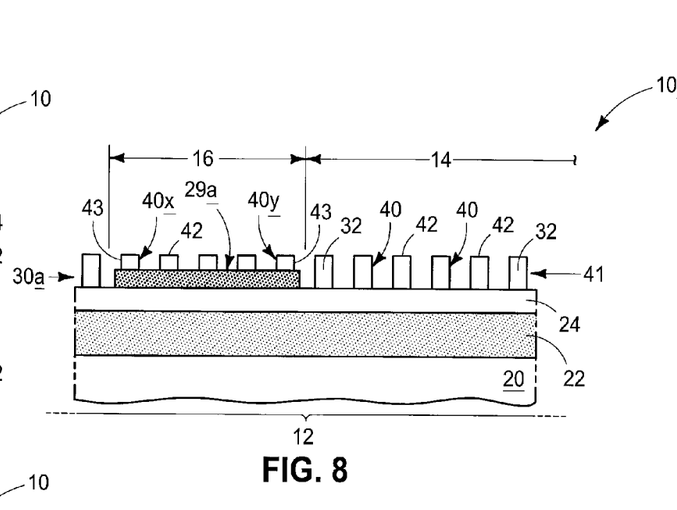
FIG. 8 is a diagrammatic cross-sectional view of a substrate fragment in process in accordance with an embodiment of the invention.

Alternately as another example, masking feature 29 may extend laterally beyond both of the laterally outermost edges of the pair of laterally outermost raised masking features, for example as shown with respect to a substrate fragment 10a in FIG. 8. Like numerals from the above-described embodiments have been used where appropriate, with some construction differences being indicated with the suffix "a". In FIG. 8, raised masking feature 29a within pattern-interrupting region 16 extends laterally beyond laterally outermost edges 43 of both of laterally outermost raised masking features 40x and 40y, forming pattern-interrupting region mask 30a.

Figure 9:
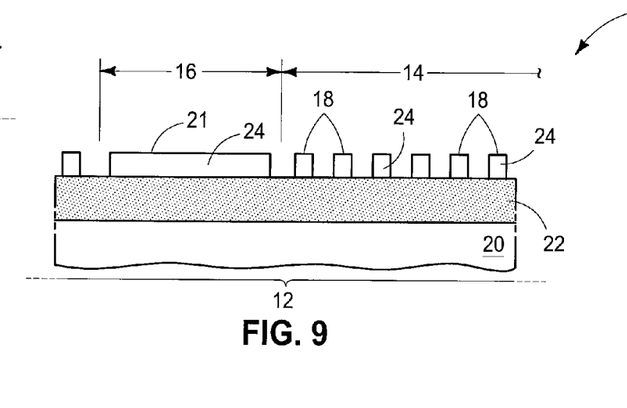
FIG. 9 is a view of the FIG. 7 substrate at a processing step subsequent to that shown by FIG. 7, and is taken through line 9-9 in FIG. 1.

In one embodiment, the patterned planarizing film and the patterned outer masking material are used as a mask in forming a pattern (e.g., FIG. 1 pattern 12) into the inner masking material. In one embodiment, the pattern-interrupting mask and the repeating pattern region mask are used as a combination mask in forming a pattern into underlying substrate material on which the combination mask is received, and for example regardless of whether a patterned planarizing film, patterned outer masking material, and inner masking material are used. Regardless, forming of the pattern into underlying substrate material in one embodiment may include etching into such underlying substrate material, for example as shown in the processing going from FIG. 7 to that of FIG. 9. In FIG. 9, combination mask 30/41 of FIG. 7 (not shown in FIG. 9) has been used as an etch mask while etching into underlying material 24/22/20 thereby forming features 18, and combination mask 30/41 has been removed during or subsequent to such etching. Alternately by way of examples, the FIG. 7 combination mask 30/41 might be used as an ion implantation and/or diffusion doping mask (not shown) in forming a desired pattern into underlying substrate material. Portions of masking features 40x and 40y that may extend slightly beyond laterally outermost edges of raised feature 29 may not necessarily resolve in inner masking material 24, as is shown.

Figure 10:
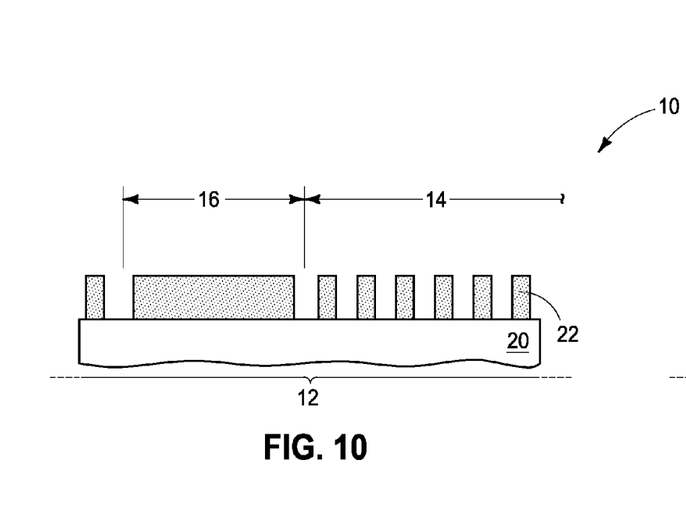
FIG. 10 is a view of the FIG. 9 substrate at a processing step subsequent to that shown by FIG. 9.

FIG. 9 shows underlying substrate material 24/22/20 in accordance with the above example description as comprising hard-masking material 22. FIG. 10 shows subsequent example processing in accordance with one embodiment, wherein the FIG. 9-patterned material 24 has been used to form a pattern in hard-masking material 22, and which has subsequently been used in FIG. 11 to etch into substrate material 20 underlying hard-masking material 22. Patterned material 24 and hard-masking material 22 are shown as having been removed in FIG. 10 and in FIG. 11, respectively. Alternately by way of examples only, masking material 22 in FIG. 10 may be used as masking to conduct diffusion doping and/or ion implanting into substrate material 20.

Figure 11:
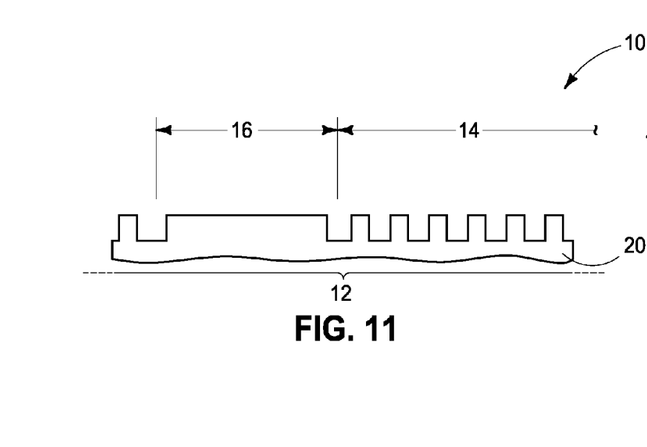
FIG. 11 is a view of the FIG. 10 substrate at a processing step subsequent to that shown by FIG. 10.

Any one or more of the example FIGS. 9-11 substrates may in top-view have the example depicted pattern of FIG. 1. Alternately or additionally, features of the substrate may be subjected to further size and/or shape modification (e.g., laterally trimming of raised features).

Figure 12:
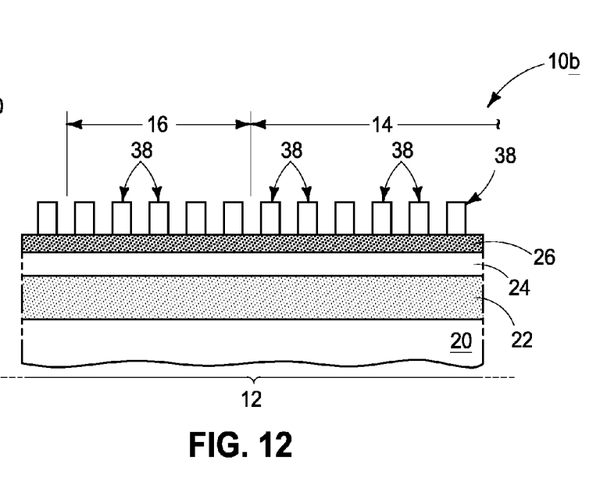
FIG. 12 is a diagrammatic cross-sectional view of a substrate fragment in process in accordance with an embodiment of the invention.

Further example embodiments are next described with reference to FIGS. 12-17 with respect to a substrate 10b. Like numerals from the above-described embodiments have been used where appropriate, with some construction differences being indicated with the suffix "b". Referring to FIG. 12, elevationally inner masking material 24 and elevationally outermost masking material 26 have been formed over underlying substrate material 22/20 analogous to the above-described embodiments. Masking features 38 have been formed over outermost masking material 26.

Figure 13:
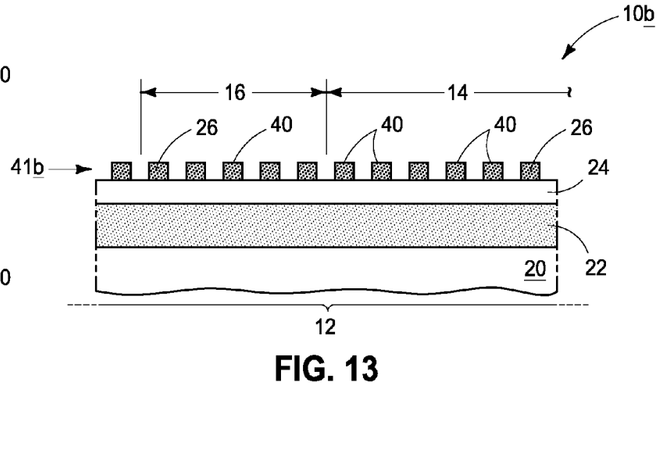
FIG. 13 is a view of the FIG. 12 substrate at a processing step subsequent to that shown by FIG. 12.

Referring to FIG. 13, masking features 38 (not shown) of FIG. 12 have been used in the patterning of outermost masking material 26 into a repeating pattern of raised masking features 40 that are elevationally over inner masking material 24 within pattern-interrupting region 16 and within repeating pattern region 14. In one embodiment, FIG. 13 may be considered as depicting formation of a repeating pattern region mask 41b elevationally over underlying substrate material 24/22/20, and which comprises multiple raised masking features 40 within repeating pattern region 14 and multiple raised masking feature 40 within pattern-interrupting region 16.

Figure 14:
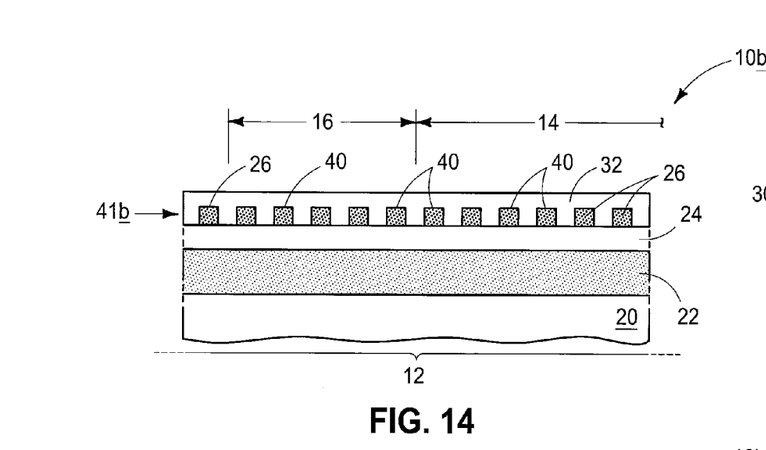
FIG. 14 is a view of the FIG. 13 substrate at a processing step subsequent to that shown by FIG. 13.

Referring to FIG. 14, planarizing film 32 has been formed elevationally over patterned outermost masking material 26.

Figure 15:
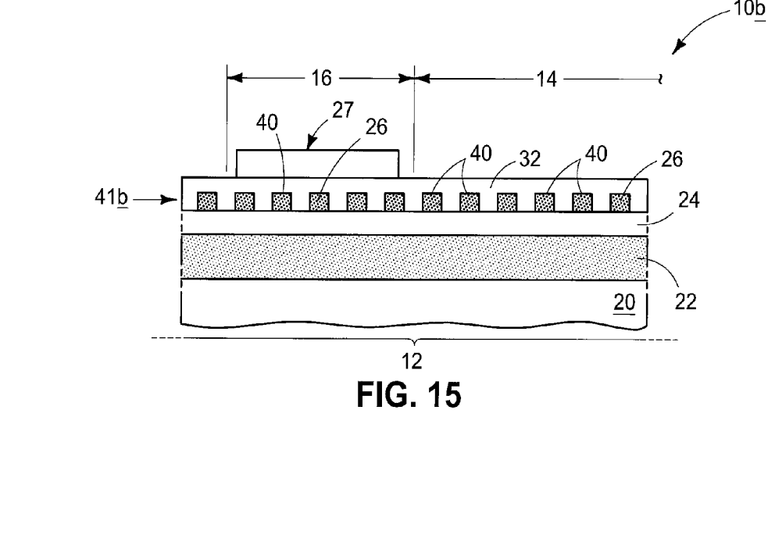
FIG. 15 is a view of the FIG. 14 substrate at a processing step subsequent to that shown by FIG. 14.

Referring to FIG. 15, masking block 27 (e.g., photoresist) has been formed over planarizing film 32 to mask pattern-interrupting region 16 (e.g., at least a majority thereof) and leave repeating pattern region 14 exposed.

Figure 16:
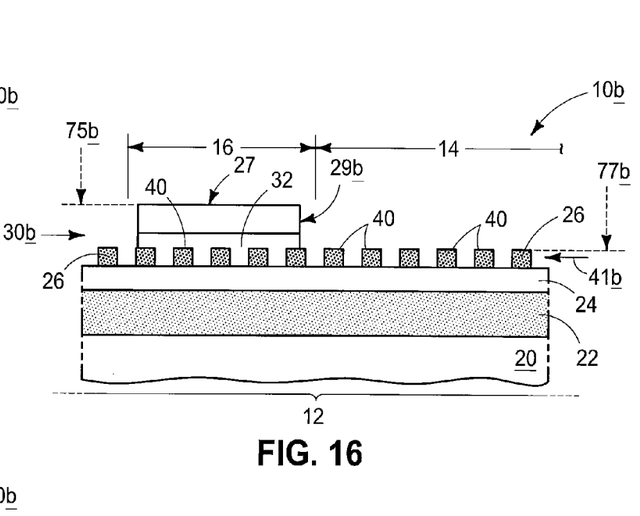
FIG. 16 is a view of the FIG. 15 substrate at a processing step subsequent to that shown by FIG. 15.

Referring to FIG. 16, planarizing film 32 has been patterned using masking block 27 to mask pattern-interrupting region 16 and leave repeating pattern region 14 exposed. Masking block 27 may or may not be removed during and/or after the processing depicted in going from FIG. 15 to FIG. 16.

In one embodiment, FIG. 16 depicts the formation of a pattern-interrupting region mask 30b comprising a raised feature 29b that is elevationally over a plurality of the multiple raised masking features 40 of repeating pattern region mask 41b within pattern-interrupting region 16, and regardless of whether a planarizing film is used. In one embodiment and as shown, pattern interrupting region mask 30b comprises at least three different composition materials including that of the plurality of multiple raised features within pattern-interrupting region 16 (e.g., at least materials 26, 32, and that of masking block 27). Alternately in one embodiment, the pattern interrupting mask may be homogenous (not shown) but for the plurality of multiple raised features within the pattern interrupting region.

Figure 17:
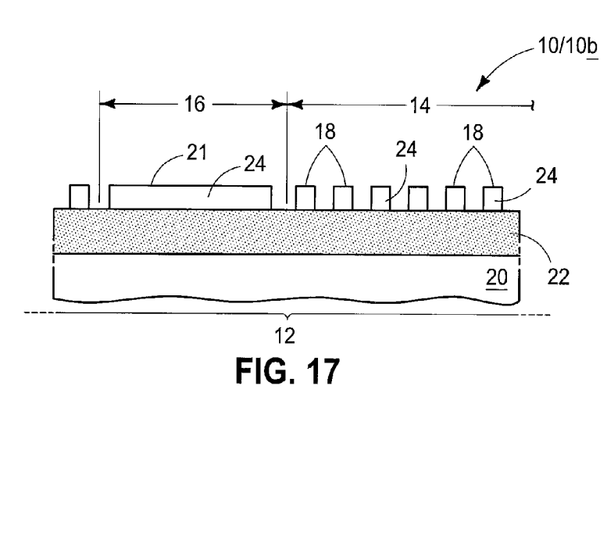
FIG. 17 is a view of the FIG. 16 substrate at a processing step subsequent to that shown by FIG. 16.

In one embodiment, patterned planarizing film 32 and the outermost masking material 26 are used as a mask in forming the pattern into inner masking material 24. In one embodiment, repeating pattern mask 41b and the pattern-interrupting region mask 30b are used as a combination mask 30b/41b in forming the pattern into underlying substrate material on which the combination mask is received. FIG. 17, for example, depicts example such embodiments whereby the example pattern has been formed into underlying/inner masking material 24, and which in the depicted embodiment is of the same construction as that of FIG. 9. Portions of masking features 40 that may extend slightly beyond laterally outermost edges of raised feature 29b may not necessarily resolve in planarizing film 32, as is shown.

Embodiments of the invention encompass a method of forming a pattern on a substrate, where the pattern comprises a repeating pattern region and a pattern-interrupting region adjacent to the repeating pattern region. Such a method forms on the substrate a mask comprising the repeating pattern region and the pattern-interrupting region using two separate masking steps. The mask is ultimately used in forming the pattern into underlying substrate material on which the mask is received. All of the embodiments described above are only but example such methods.

In one embodiment, the mask step which forms the repeating pattern region also forms a repeating feature pattern of the repeating pattern region within the pattern interrupting region, and further comprises subsequently removing the repeating feature pattern from the pattern interrupting region. In one embodiment, the two masking steps form raised masking features that have elevationally outermost surfaces that are at different substrate elevations in one masking step relative to the other masking step. Each of the above-described general embodiments with respect to FIGS. 1-11 and with respect to FIGS. 12-17 are but example such embodiments (e.g., different example substrate elevations 75, 77 and 75b, 77b being shown in FIG. 7 and FIG. 16, respectively). In the embodiments described with respect to FIGS. 1-11, substrate elevation 75 within the pattern interrupting region is everywhere elevationally inward of substrate elevation 77 within the repeating pattern region. In the embodiments of FIGS. 12-17, substrate elevation 75b within the pattern interrupting region is everywhere elevationally outward of substrate elevation 77b within the repeating pattern region.

In one embodiment, the masking step used in forming the repeating pattern region of the mask comprises pitch multiplication. In one embodiment each masking step comprises photolithography. In one embodiment, the masking step used in forming the repeating pattern region of the mask comprises pitch multiplication and the masking step used in forming the pattern interrupting region of the mask does not comprise pitch multiplication.

In one embodiment, the method is void of forming any of dummy features and relaxed pitch features in the mask between the repeating pattern region and the pattern-interrupting region.

Embodiments of the invention encompass substrates independent of method of use or manufacture. In one embodiment, a substrate comprises a repeating pattern region and a pattern-interrupting region adjacent to the repeating pattern region. A pattern-interrupting region mask is elevationally over underlying substrate material. The pattern-interrupting region mask comprises a raised masking feature. A repeating pattern region mask is elevationally over the pattern-interrupting region mask. The repeating pattern region mask comprises multiple raised masking features that are elevationally over the raised masking feature of the pattern-interrupting region mask and multiple raised masking features that are not elevationally over the raised masking feature of the pattern-interrupting region mask. Other construction features as identified above may be part of the substrate.

In one embodiment, a substrate comprises a repeating pattern region and a pattern-interrupting region adjacent to the repeating pattern region. A repeating pattern region mask is elevationally over underlying substrate material. The repeating pattern region mask comprises multiple raised masking features within the repeating pattern region and multiple raised masking features within the pattern-interrupting region. A pattern-interrupting region mask is elevationally over the repeating pattern region mask. The pattern-interrupting region mask comprising a raised masking feature that is elevationally over a plurality of the multiple raised masking features of the repeating pattern region mask within the pattern-interrupting region. Other construction features as identified above may be part of the substrate.

CONCLUSION

In some embodiments, a method of forming a pattern on a substrate, where the pattern comprises a repeating pattern region and a pattern-interrupting region adjacent to the repeating pattern region, comprises forming on the substrate a mask comprising the repeating pattern region and the pattern-interrupting region using two separate masking steps. The mask is used in forming the pattern into underlying substrate material on which the mask is received.

In some embodiments, a method of forming a pattern on a substrate, where the pattern comprises a repeating pattern region and a pattern-interrupting region adjacent to the repeating pattern region, comprises forming a pattern-interrupting region mask elevationally over underlying substrate material. The pattern-interrupting region mask comprises a raised masking feature. A repeating pattern region mask is formed elevationally over the pattern-interrupting region mask. The repeating pattern region mask comprises multiple raised masking features that are elevationally over the raised masking feature of the pattern-interrupting region mask and multiple raised masking features that are not elevationally over the raised masking feature of the pattern-interrupting region mask. The pattern-interrupting region mask and the repeating pattern region mask are used as a combination mask in forming the pattern into the underlying substrate material on which the combination mask is received.

In some embodiments, a method of forming a pattern on a substrate, where the pattern comprises a repeating pattern region and a pattern-interrupting region adjacent to the repeating pattern region, comprises forming a repeating pattern region mask elevationally over underlying substrate material. The repeating pattern region mask comprises multiple raised masking features within the repeating pattern region and multiple raised masking features within the pattern-interrupting region. A pattern-interrupting region mask is formed elevationally over the repeating pattern region mask. The pattern-interrupting region mask comprises a raised masking feature that is elevationally over a plurality of the multiple raised masking features of the repeating pattern region mask within the pattern-interrupting region. The repeating pattern mask and the pattern-interrupting region mask are used as a combination mask in forming the pattern into the underlying substrate material on which the combination mask is received.

In some embodiments, a method of forming a pattern on a substrate, where the pattern comprises a repeating pattern region and a pattern-interrupting region adjacent to the repeating pattern region, comprises forming elevationally inner and elevationally outer masking material elevationally over underlying substrate material. The outer masking material is patterned to mask the pattern-interrupting region and expose the repeating pattern region. A planarizing film is formed elevationally over the patterned outer masking material and over the inner masking material. The planarizing film is patterned into a repeating pattern of raised masking features that are elevationally over the patterned outer masking material within the pattern-interrupting region and elevationally over the inner masking material within the repeating pattern region. The patterned planarizing film and the patterned outer masking material are used as a mask in forming the pattern into the inner masking material.

In some embodiments, a method of forming a pattern on a substrate, where the pattern comprises a repeating pattern region and a pattern-interrupting region adjacent to the repeating pattern region, comprises forming elevationally inner and elevationally outer masking material elevationally over underlying substrate material. The outer masking material is patterned into a repeating pattern of raised masking features that are elevationally over the inner masking material within the pattern-interrupting region and the repeating pattern region. A planarizing film is formed elevationally over the patterned outer masking material. The planarizing film is patterned to mask the pattern-interrupting region and leave the repeating pattern region exposed. The patterned planarizing film and the patterned outer masking material are used as a mask in forming the pattern into the inner masking material.

In some embodiments, a substrate comprises a repeating pattern region and a pattern-interrupting region adjacent to the repeating pattern region. A pattern-interrupting region mask is elevationally over underlying substrate material. The pattern-interrupting region mask comprises a raised masking feature. A repeating pattern region mask is elevationally over the pattern-interrupting region mask. The repeating pattern region mask comprises multiple raised masking features that are elevationally over the raised masking feature of the pattern-interrupting region mask and multiple raised masking features that are not elevationally over the raised masking feature of the pattern-interrupting region mask.

In some embodiments, a substrate comprises a repeating pattern region and a pattern-interrupting region adjacent to the repeating pattern region. A repeating pattern region mask is elevationally over underlying substrate material. The repeating pattern region mask comprises multiple raised masking features within the repeating pattern region and multiple raised masking features within the pattern-interrupting region. A pattern-interrupting region mask is elevationally over the repeating pattern region mask. The pattern-interrupting region mask comprising a raised masking feature that is elevationally over a plurality of the multiple raised masking features of the repeating pattern region mask within the pattern-interrupting region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A substrate comprising a repeating pattern region and a pattern-interrupting region adjacent to the repeating pattern region, comprising:
   a pattern-interrupting region mask elevationally over underlying substrate material, the pattern-interrupting region mask comprising masking material, the masking material of the pattern-interrupting region mask forming a raised masking feature within the pattern-interrupting region, none of the masking material of the pattern-interrupting region mask being within the repeating pattern region; and
   a repeating pattern region mask elevationally over the pattern-interrupting region mask, the repeating pattern region mask comprising multiple raised masking features that are elevationally over the raised masking feature of the pattern-interrupting region mask within the pattern interrupting region and multiple raised masking features that are not elevationally over the raised masking feature of the pattern-interrupting region mask within a repeating pattern region, the repeating pattern region being different from and everywhere laterally of the pattern-interrupting region, the repeating pattern region and the pattern-interrupting region being immediately laterally adjacent one another.

2. The substrate of claim 1 being void of any of dummy features and relaxed pitch features between the repeating pattern region and the pattern-interrupting region.

3. The substrate of claim 1 wherein the repeating pattern region comprises a repeating feature pattern that is of constant pitch at least immediately adjacent to the pattern-interrupting region.

4. The substrate of claim 1 wherein the multiple raised masking features that are elevationally over the raised masking feature in the pattern-interrupting region comprise a pair of laterally-outermost raised masking features relative to the raised masking feature in the pattern-interrupting region, the raised masking feature in the pattern-interrupting region extending laterally beyond the laterally-outermost edges of the pair of laterally-outermost raised masking features.

5. The substrate of claim 1 wherein the multiple raised masking features that are elevationally over the raised masking feature in the pattern-interrupting region comprise a pair of laterally-outermost raised masking features relative to the raised masking feature in the pattern-interrupting region, the raised masking feature in the pattern-interrupting region not extending laterally beyond the laterally-outermost edges of the pair of laterally-outermost raised masking features thereby a portion of each of the laterally-outermost raised masking features of the pair extending laterally beyond one of opposing laterally outermost edges of the raised masking feature in the pattern-interrupting region, said portions extending laterally beyond said respective one opposing laterally outermost edge of the raised masking feature different amounts relative one another.

6. The substrate of claim 1 wherein the multiple raised masking features that are over and not over the raised masking feature have respective elevationally outermost surfaces that are planar.

7. The substrate of claim 6 wherein the planar outermost surfaces are coplanar.

8. The substrate of claim 1 wherein the multiple raised masking features that are elevationally over the raised masking feature in the pattern-interrupting region comprise a pair of laterally-outermost raised masking features relative to the raised masking feature in the pattern-interrupting region, the raised masking feature in the pattern-interrupting region not extending laterally beyond only one of the laterally-outermost edges of the pair of laterally-outermost raised masking features.

9. A substrate comprising a repeating pattern region and a pattern-interrupting region adjacent to the repeating pattern region, comprising:
a repeating pattern region mask elevationally over underlying substrate material, the repeating pattern region mask comprising multiple raised masking features within the repeating pattern region and multiple raised masking features within the pattern-interrupting region; and
a pattern-interrupting region mask elevationally over the repeating pattern region mask, the pattern-interrupting region mask comprising masking material, the masking material of the pattern-interrupting region mask forming a raised masking feature that is elevationally over a plurality of the multiple raised masking features of the repeating pattern region mask within the pattern-interrupting region, none of the masking material of the raised masking feature of the pattern-interrupting region mask being within the repeating pattern region.

10. The substrate of claim 9 wherein the pattern-interrupting mask comprises at least three different composition materials including that of the plurality of multiple raised features within the pattern-interrupting region.

11. The substrate of claim 9 wherein the pattern-interrupting mask is homogenous but for the plurality of multiple raised features within the pattern-interrupting region.

12. The substrate of claim 9 being void of any of dummy features and relaxed pitch features between the repeating pattern region and the pattern-interrupting region.

13. The substrate of claim 9 wherein the repeating pattern region comprises a repeating feature pattern that is of constant pitch at least immediately adjacent to the pattern-interrupting region.

\* \* \* \* \*